(12) United States Patent
Lukyanov et al.

(10) Patent No.: US 12,482,745 B2
(45) Date of Patent: Nov. 25, 2025

(54) WIRELESS INTERCONNECT FOR HIGH-RATE DATA TRANSFER

(71) Applicant: SAMSUNG ELECTRONICS CO., LTD., Suwon-si (KR)

(72) Inventors: Anton Sergeevich Lukyanov, Moscow (RU); Mikhail Nikolaevich Makurin, Moscow (RU)

(73) Assignee: Samsung Electronics Co., Ltd., Suwon-si (KR)

(*) Notice: Subject to any disclaimer, the term of this patent is extended or adjusted under 35 U.S.C. 154(b) by 460 days.

(21) Appl. No.: 18/077,570

(22) Filed: Dec. 8, 2022

(65) Prior Publication Data

US 2023/0178480 A1    Jun. 8, 2023

Related U.S. Application Data

(63) Continuation of application No. PCT/KR2022/019933, filed on Dec. 8, 2022.

(30) Foreign Application Priority Data

Dec. 8, 2021   (RU) ............................ RU2021136214

(51) Int. Cl.
*H01L 23/522* (2006.01)
*H05K 1/02* (2006.01)

(52) U.S. Cl.
CPC ....... *H01L 23/5227* (2013.01); *H05K 1/0236* (2013.01)

(58) Field of Classification Search
CPC .. H01L 23/5227; H05K 1/0236; H05K 1/144; H05K 2201/042; H05K 2201/10098;
(Continued)

(56) References Cited

U.S. PATENT DOCUMENTS

| | | | |
|---|---|---|---|
| 2011/0248901 A1 | 10/2011 | Alexopoulos et al. | |
| 2014/0273837 A1* | 9/2014 | McCormack | H02J 50/80 455/41.1 |

(Continued)

FOREIGN PATENT DOCUMENTS

| | | |
|---|---|---|
| CN | 105226359 | 1/2016 |
| CN | 112259944 | 1/2021 |

(Continued)

OTHER PUBLICATIONS

Search Report and Written Opinion dated Mar. 13, 2023 issued in International Patent Application No. PCT/KR2022/019933.
(Continued)

*Primary Examiner* — Renan Luque
(74) *Attorney, Agent, or Firm* — Nixon & Vanderhye P.C.

(57) ABSTRACT

The present disclosure relates generally to radio engineering, and for example, to high-rate wireless data transfer between different printed circuit boards or between parts of the same printed circuit board. The technical result is easier fabrication, smaller dimensions, lower losses at high frequencies and improved performance. According to the disclosure, a wireless data transfer system comprises: two printed circuit boards separated by an air gap, between which a transverse electromagnetic (TEM) mode waveguide is formed, wherein each printed circuit board includes a converter structure configured to: perform conversion between the signal transmission line mode and TEM mode in the waveguide, connected to an RF component; wherein the converter structure includes: an antenna, a signal transmission line between the antenna and the RF component, and at least one reflector configured to provide directive propagation of the TEM mode in the waveguide; wherein the width of the air gap between the printed circuit boards does
(Continued)

not exceed λ/4, where λ is the wavelength of the transmitted signal.

15 Claims, 6 Drawing Sheets

(58) Field of Classification Search
CPC ........ H01P 1/2005; H01P 5/028; H01P 5/107; H01Q 9/045
See application file for complete search history.

(56) References Cited

U.S. PATENT DOCUMENTS

| | | |
|---|---|---|
| 2018/0027647 A1 | 1/2018 | Rengarajan et al. |
| 2020/0076037 A1 | 3/2020 | Kishk et al. |
| 2020/0185802 A1 | 6/2020 | Vilenskiy et al. |

FOREIGN PATENT DOCUMENTS

| | | |
|---|---|---|
| CN | 113451727 | 9/2021 |
| WO | 2009/023753 | 2/2009 |

OTHER PUBLICATIONS

Martini, "Transformation Method for PTD Symmetric Edge Waveguide", EuCAP 2019, Mar. 31, 2019, 3 pages.
Salarrahimi, "Exciting the Edge Mode in a Dual Metasurface PTD Symmetric Waveguide", Feb. 13, 2020, 2 pages.
Extended European Search Report dated Sep. 12, 2024 issued in European Patent Application No. 22904689.1.

* cited by examiner

WIRELESS INTERCONNECT FOR HIGH-RATE DATA TRANSFER

CROSS-REFERENCE TO RELATED APPLICATIONS

This application is a PCT-Bypass Continuation Application, claiming priority under § 365(c), of an International application No. PCT/KR2022/019933, filed on Dec. 8, 2022, which is based on and claims the benefit of a Russian Patent Application No. 2021136214, filed on Dec. 8, 2021, in the Russian Patent Office, the disclosures of which are incorporated by reference herein in its entirety.

BACKGROUND

Field

The disclosure relates to radio engineering, and for example, to high-rate wireless data transfer between different printed circuit boards or between parts of the same printed circuit board.

Description of Related Art

The currently growing amount of data transfer between different electronic devices demonstrates the need for high-rate data transfer systems having compact size, simple architecture, low losses, high reliability and efficiency, low cost, etc. These requirements are of particular importance for wireless data transfer systems that are commonly used in various mobile and stationary electronic devices.

Such data transfer systems find application, for example, in communication systems of new and promising data transfer standards, such as 5G (28 GHz), WiGig (60 GHz), Beyond 5G (60 GHz) and 6G (subterahertz band), long-distance wireless power transmission systems (LWPT) (24 GHz), vehicle radar systems (24 GHz, 79 GHz), etc.

The above circumstances are typical not only for data transfer between electronic devices, but also for data transfer between different boards (components) within such devices. All of these and similar systems require highly efficient, functional, yet simple and reliable components suitable for mass production.

One of the above components may include an interconnect (or connector) for transmitting data over a short distance between different printed circuit boards (PCBs) or between sections of the same PCB. The interconnect should meet the following main requirements: preferably be wireless, have low loss and compact signal supply system, unsophisticated, inexpensive, compact, reproducible hardware, applicable for mass production; the interconnect should be preferably a part of a PCB or an integrated antenna, rather than a separate component; at the same time, it should support stable reception at a high data rate (>2 Gbit/s); and support for high performance multilayer PCB antennas is also preferred. However, in an attempt to adapt to the millimeter wavelength range, the existing techniques turn out to be unsuitable to satisfy the above requirements to the fullest extent, since they are either too expensive or too cumbersome, or require isolation or precise mechanical assembly, or do not provide the specified data rate.

In particular, conventional electrical board-to-board interconnection methods for short distance data transfer can be conditionally divided into two groups: wired interconnect (conventional galvanic interconnect using metal conductors) and wireless interconnect, which, in turn, can be divided into two subgroups: radio interconnect and optical interconnect.

One example of galvanic interconnect is surface mount (SMD) connectors with components mounted or arranged directly on the surface of a printed circuit board (PCB). Another example is RF (radio frequency) connectors mounted on the PCB surface and providing a PCB-to-PCB interconnect. Such PCB-to-PCB interconnection methods require galvanic contact to provide transition in the RF channel. These approaches experience problems associated with, for example, low transmission frequency: SMD connectors operate at frequencies up to 20 GHZ, and RF connectors operate at frequencies up to 65 GHz. They are very sensitive to mechanical and thermal stresses, as well as to misalignments while assembling and soldering, resulting in low reliability of contacts, changing the RF transition parameters, increased losses and, ultimately, early failure of contacts. Therefore, assembly and installation require a lot of time and a minimum distance of >8 mm must be maintained between the boards.

An example of wireless radio communication is NFC (Near Field Communication) data transfer. Existing NFC techniques experience problems of shielding magnetic field, which require using ferrite shielding and increase space. Such solutions have a narrow bandwidth and low data rate (up to 2.1 Mbit/s), since the carrier frequency of this method is 13.56 MHz.

Existing optical technologies have inherent problems with the need for direct view between the transmitter and the receiver, as well as with beam control, which is mandatory as the receiver size is small relative to the device dimensions. Therefore, complex precise mechanics and tuning are required, which increase the space, seriously changes the optic communication parameters and increases losses.

In the related art, including, for example, US 2019/0379426 A1 discloses a wireless data transfer system, in which the transmitter and receiver are disposed on separate substrates, or carriers, that are positioned relative to each other such that, in operation, antennas of the transmitter/receiver pair are separated by a distance such that, at wavelengths of the transmitter carrier frequency, near-field coupling is obtained. However, here antenna elements are integrated in the integral circuits located on separated boards. The integration of antenna elements in integral circuits prohibits prompt changes to the antenna design to meet the required characteristics during mass production.

US 2017/0250726 A1 discloses a wireless connector including a first communication device and a second communication device. The first communication device is configured to wirelessly transmit a modulated signal comprising a carrier signal modulated with a digital signal. The second communication device is configured to receive the modulated signal. The first and second communication devices are coupled through at least one wired connection that carries a signal used to demodulate the modulated signal. Therefore, the device needs at least one galvanic connection for demodulation. Moreover, antenna elements are integrated in integral circuits that are located on separated boards.

U.S. Pat. No. 8,041,227 B2 discloses a communication device having optical and near-field communication capability. The device includes an optical transceiver circuit fabricated on an integrated circuit die and configured to transmit and receive far field signals. A near field transceiver circuit is also fabricated on the integrated circuit die and is configured to transmit and receive near-field electro-magnetic signals. Control circuitry is provided to selectively enable the optic transceiver circuit and the near field transceiver circuit responsive to an external control signal. However, the IR data transfer circuit used in the device has insufficient data rate. Furthermore, additional RF channel is needed for pairing of devices.

The disclosure of US 2009/0289869 A1 provides an antenna structure for coupling electromagnetic energy between a chip and an off-chip element, including a first resonant structure disposed on or in a chip. The first resonant structure is configured to have a first resonant frequency. The antenna structure also includes a second resonant structure disposed on or in an off-chip element. The second resonant structure is configured to have a second resonant frequency substantially the same as the first resonant frequency. The first resonant structure and the second resonant structure are mutually disposed within a near field distance of each other to form a coupled antenna structure that is configured to couple electromagnetic energy between the chip and the off-chip element. The electromagnetic energy has a selected wavelength in a wavelength range from microwave to sub-millimeter wave. However, the device has a narrow transmission bandwidth and does not support operation at millimeter and sub-terahertz wavelengths.

Another disclosure in this field is the publication by N. Bayat-Makou, A. Kishk, entitled, "Contactless Air-Filled Substrate Integrated Waveguide," IEEE Transactions on Microwave Theory and Techniques (Volume: 66, Issue: 6, June 2018). The publication introduces for the first time a contactless version of the air-filled substrate integrated waveguide (AF-SIW). The conventional AF-SIW configuration requires a precise and flawless connection of the covering layers to the intermediate substrate. To operate efficiently at high frequencies, this requires a complicated and costly fabrication process. In this configuration, the waveguide comprises an upper and lower conductive layers between which an air-filled medium is disposed, and printed circuit boards positioned on the sides. Upper and lower layers of the built-in printed circuit boards are modified to obtain artificial magnetic conductor (AMC) boundary conditions. The AMC surfaces on both sides of the waveguide substrate are realized by a single-periodic structure with the new type of unit cells. The AMC plates thus formed, which lie parallel to the conductive layers in the substrate region, prevent leakage outside the waveguide. However, this structure exhibits relatively high losses at the required frequencies and needs to be improved.

Therefore, the existing techniques have a number of disadvantages, including, for example:
high losses;
low data rate;
large size;
high complexity of fabrication;
strong dependence on the quality of contact between conductive elements.

Therefore, there is currently a need for a compact, reliable, simple and inexpensive wireless system to provide high-rate data transfer between components of electronic devices.

SUMMARY

According to an example embodiment, there is provided a wireless data transfer system, comprising: two printed circuit boards separated by an air gap, wherein each printed circuit board includes two adjacent parts, a first part of the printed circuit board comprising: a conductive metal layer on its surface and at least a series of plated through holes (VIAs) along the adjacent second part, and a second part of the printed circuit board comprising an EBG (electromagnetic band gap) structure, wherein the first part of the first printed circuit board with the metal surface layer is positioned opposite the second part of the second printed circuit board with the EBG structure, and vice versa, to form a transverse electromagnetic (TEM) mode waveguide; wherein each printed circuit board includes a converter structure configured to: perform conversion between the signal transmission line mode and the TEM mode in the waveguide, provide directive excitation of TEM mode in the waveguide based on a signal being transmitted, and receive TEM mode and convert it to the signal transmission line mode based on a signal being received, and connected to an RF component comprising RF circuitry; wherein the converter structure comprises an antenna, a signal transmission line between the antenna and the RF component, and at least one reflector configured to provide directive propagation of the TEM mode in the waveguide; wherein a width of the air gap between the printed circuit boards does not exceed $\lambda/4$, where $\lambda$ is the wavelength of the transmitted signal.

According to an example embodiment, there is provided a wireless data transfer system, comprising: two printed circuit boards separated by an air gap, wherein each printed circuit board includes two adjacent parts, a first part of the printed circuit board comprising: a conductive metal layer on its surface and at least a series of plated through holes (VIAs) along the adjacent second part, and a second part of the printed circuit board comprising an EBG (electromagnetic band gap) structure, wherein the first part of the first printed circuit board with the metal surface layer is positioned opposite the second part of the second printed circuit board with the EBG structure, and vice versa, to form a transverse electromagnetic (TEM) mode waveguide; wherein one printed circuit board includes two converter structures configured to: perform conversion between the signal transmission line mode and TEM mode in the waveguide, each of the two converter structures being configured to provide directive excitation of TEM mode in the waveguide based on a signal being transmitted, and receive TEM mode and convert it to the signal transmission line mode based on a signal being received, and connected to an RF component comprising RF circuitry; wherein the converter structure includes: an antenna, a signal transmission line between the antenna and the RF component, and at least one reflector configured to provide directive propagation of the TEM mode in the waveguide; wherein the width of the air gap between the printed circuit boards does not exceed $\lambda/4$, where $\lambda$ is the wavelength of the transmitted signal.

In an example embodiment, the antenna includes a conductive probe extending into the second part of the printed circuit board with the EBG structure.

In an example embodiment, the antenna comprises a slotted structure.

In an example embodiment, the reflector is mounted at a distance of at least $\lambda/8$ from the antenna on the side opposite to the required direction of TEM mode propagation.

In an example embodiment, the reflector is mounted at a distance of $\lambda/4$ from the antenna.

In an example embodiment, the converter structure includes two reflectors positioned at a distance of at least $\lambda/8$ from each other.

In an example embodiment, the reflectors are positioned at a distance of $\lambda/4$ from each other.

In an example embodiment, the reflector includes a probe connected to the metal layer of the first part of the printed circuit board and extending towards the EBG structure, or a slot in the metal layer of the first part of the printed circuit board.

In an example embodiment, the converter structure further comprises at least one guide arranged in the direction of TEM mode propagation at a distance of at least $\lambda/8$ from the antenna.

In an example embodiment, the guide is positioned at a distance of $\lambda/4$ from the antenna.

In an example embodiment, the guide includes a probe connected to the metal layer of the first part of the printed circuit board and extending towards the EBG structure, or a slot in the metal layer of the first part of the printed circuit board.

In an example embodiment, the printed circuit boards comprise a two-layer or a three-layer printed circuit board.

In an example embodiment, the RF component comprises a radio frequency integrated circuit (RFIC).

In an example embodiment, a distance between VIA edges located in the first part of the printed circuit board along the second part of the printed circuit board is not more than $\lambda/2$.

The present disclosure provides a high data transmission rate and also enhances the reliability and efficiency of the wireless data transfer system having a simple architecture and compact size.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Embodiments of the disclosure are not limited to those described herein, and various embodiments will become apparent to those skilled in the art, without departing from the spirit and scope of the disclosure, based on the information set forth in the description and the knowledge of one of ordinary skill in the art.

Figure 1:
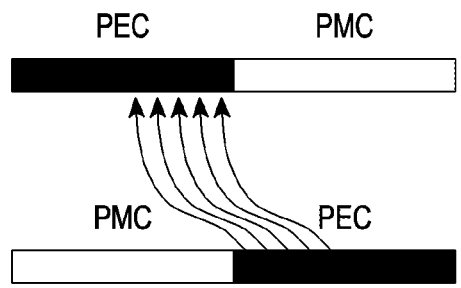
FIG. 1 is a diagram illustrating an example TEM mode waveguide according to various embodiments.
Figure 2:
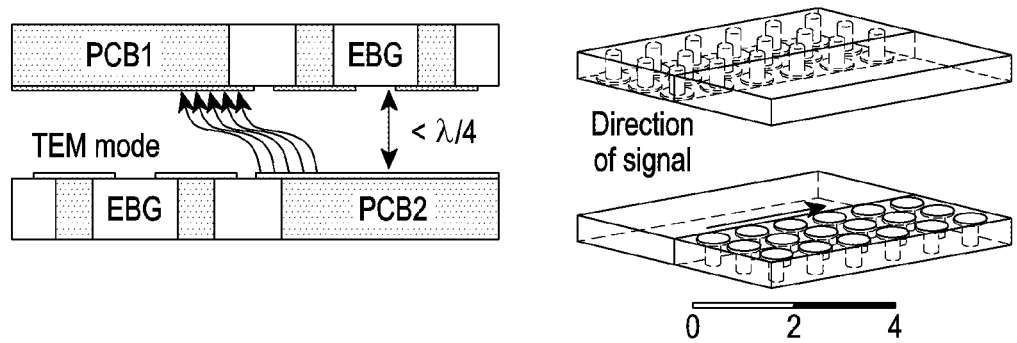
FIG. 2 is a diagram illustrating an example TEM mode waveguide according to various embodiments.
Figure 3:
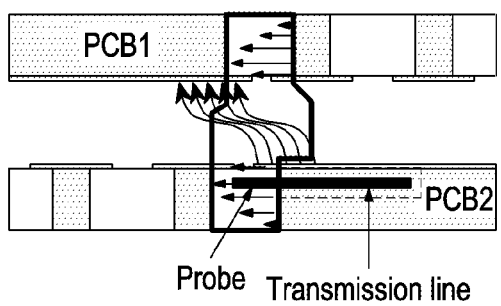
FIG. 3 is a diagram illustrating a region of a TEM mode waveguide, in which TEM mode propagates according to various embodiments.

A wireless data transfer system according to the present disclosure includes implementation of a parallel-plate Parity Time-Reversal Duality (PTD) waveguide, an example of the structure of the PTD is illustrated in FIG. 1, where PEC may refer, for example, to a perfect electric conductor, and PMC may refer, for example, to a perfect magnetic conductor. A PTD waveguide supports propagation of Transverse Electromagnetic (TEM) mode along a direction normal to the plane of the drawing, while electric field lines are normal to PEC surfaces, and magnetic field lines are normal to PMC, respectively. TEM mode may refer, for example, to a mode in which neither electric nor magnetic field has projection in the direction of the mode propagation. The mode field is concentrated at the PMC/PEC transition. This mode was first described in the article by Chen, W.-J. et al. "Symmetry-protected transport in a pseudospin-polarized waveguide", Nature Communications. 6:8183 doi: 10.1038/ncomms9183 (2015), the disclosure of which is incorporated by reference herein in its entirety. The waveguide mode demonstrates the field distribution and represents the solution of equations of electrodynamics in the waveguide in the form of a traveling wave. The analytical solution for the TEM mode and the practical implementation of the PTD waveguide based on the EBG structure, is illustrated in FIG. 2, and presented in the article by E. Martini, M. G. Silveirinha and S. Maci, "Exact Solution for the Protected TEM Edge Mode in a PTD-Symmetric Parallel-Plate Waveguide," IEEE Transactions on Antennas and Propagation, vol. 67, no. 2, pp. 1035-144 Feb. 2019, doi: 10.1109/TAP.2018.2880091, the disclosure of which is incorporated by reference herein in its entirety. In the implementation illustrated in FIG. 2, PEC is realized by a conductive metal layer on the PCB surface, and PMC is realized by EBG (Electromagnetic Band Gap) structure. The alternation of the EBG structure with the conductive material provides propagation of the TEM mode.

A wireless data transfer system in accordance with an example embodiment of the present disclosure will be described in greater detail below with reference to FIGS. 2 to 6.

In an example embodiment of the present disclosure, the wireless data transfer system may include two printed circuit boards (PCBs) separated by an air gap. The PCBs are electromagnetically coupled by forming a TEM mode waveguide between them using EBG structures (see, e.g., FIG. 2). The alternation of the EBG structure with the conductive material in the PCBs makes it possible to form a compact TEM mode waveguide. The TEM mode waveguide may be the narrowest waveguide among transmission lines based on EBG structures and may have a transverse dimension less than $\lambda/2$, where $\lambda$ is the wavelength of the transmitted signal. This arrangement also makes it possible to form a compact multichannel waveguide from several parallel waveguides located adjacently (at the closest possible distance). The TEM mode waveguide may be formed at the junction of the PCB part with a surface conductive layer and the PCB part with an EBG structure.

Each PCB includes, for example, a converter structure for conversion between the signal transmission line mode and the TEM mode in the waveguide and a radio frequency (RF) component connected to it, which generates/transmits a signal. The RF component can be e.g. an RFIC (Radio Frequency Integrated Circuit), a transceiver, a connector for further connection to a transceiver, etc. The converter structure performs directive excitation of the TEM mode in the waveguide when a signal is transmitted, and also performs reception of the TEM mode and conversion to the signal transmission line mode when a signal is received. The waveguide region in which the TEM mode propagates is illustrated by a solid thick line in FIG. 3. A signal transmitted from the converter structure of the first PCB through the TEM mode waveguide to the converter structure of the second PCB (see, e.g., FIG. 4). It should be noted that the first PCB and the second PCB may belong to different devices (e.g., units of the same device) between which wireless data transfer is to be provided in accordance with the present disclosure. In an embodiment, the devices can be permanently connected to each other to form a TEM mode waveguide with a structure described in greater detail below. In an embodiment, the devices can be detachably connected to each other by fastening means which, when connected, form a TEM mode waveguide with a structure described in detail below.

As mentioned above and illustrated in FIG. 4, the wireless data transfer system according to the present disclosure may include two printed circuit boards (PCB1 and PCB2) separated by an air gap. The width of the gap should not exceed $\lambda/4$, where $\lambda$ is the wavelength of the transmitted signal. The PCB may include two adjacent parts: a first part of the PCB contains a conductive metal layer on its surface and at least a series of plated through holes (e.g., VIAs) along the adjacent second part, and a second part of the PCB may include an EBG structure (described in greater detail below). Moreover, the first part of the PCB1 is disposed opposite the second part of the PCB2 with the EBG structure, and vice versa, thus forming a TEM mode waveguide.

Figure 4:
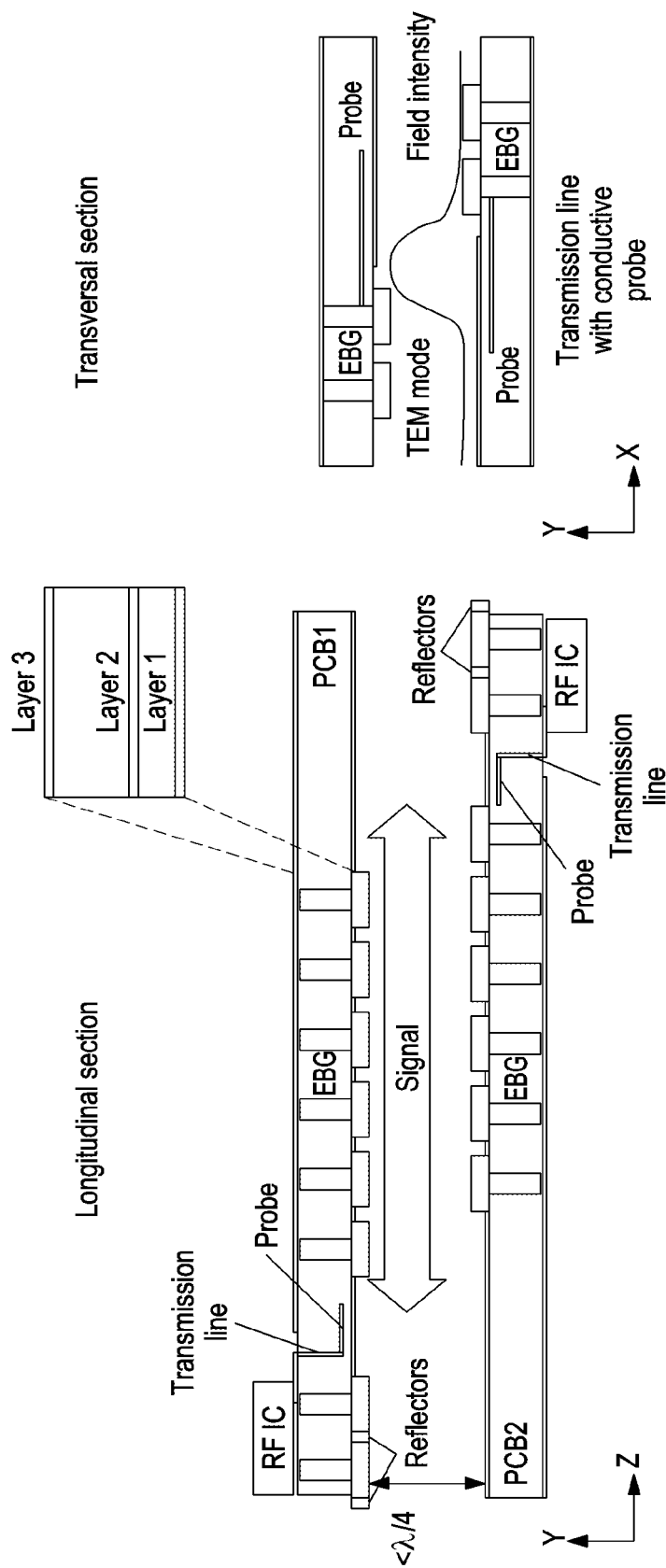
FIG. 4 is a diagram illustrating a longitudinal (left) and transverse (right) section of a wireless data transfer system according to various embodiments.

In an example embodiment illustrated in FIG. 4, each PCB may include multiple layers. For example, each PCB may be a three-layer PCB including layer 1, layer 2, and layer 3. First part of the PCB contains at least a series of VIAs through the thickness of the dielectric layer of the PCB (layer 1-layer 3) along the adjacent second part of the PCB. The VIAs shield the PCB under this metal surface layer to prevent/reduce the waveguide field from leaking into this space. Accordingly, the distance between VIA edges located along the second part of the PCB should be no more than $\lambda/2$. Layer 3 of the PCB comprises an RFIC connected to the converter structure for directive radiation of TEM mode. The converter structure includes an antenna disposed on layer 2 of the PCB, a transmission line for transmitting a signal between the RFIC and the antenna, and at least one reflector disposed on layer 1 or layer 2. In an example embodiment, the antenna may be formed by a conductive probe (e.g., a stripline), which is similar to the excitation of a rectangular waveguide by an electric probe. The probe extends to the second part of the PCB with the EBG structure (this is pin antenna). This makes it possible to excite the TEM mode in the waveguide.

Figure 7:
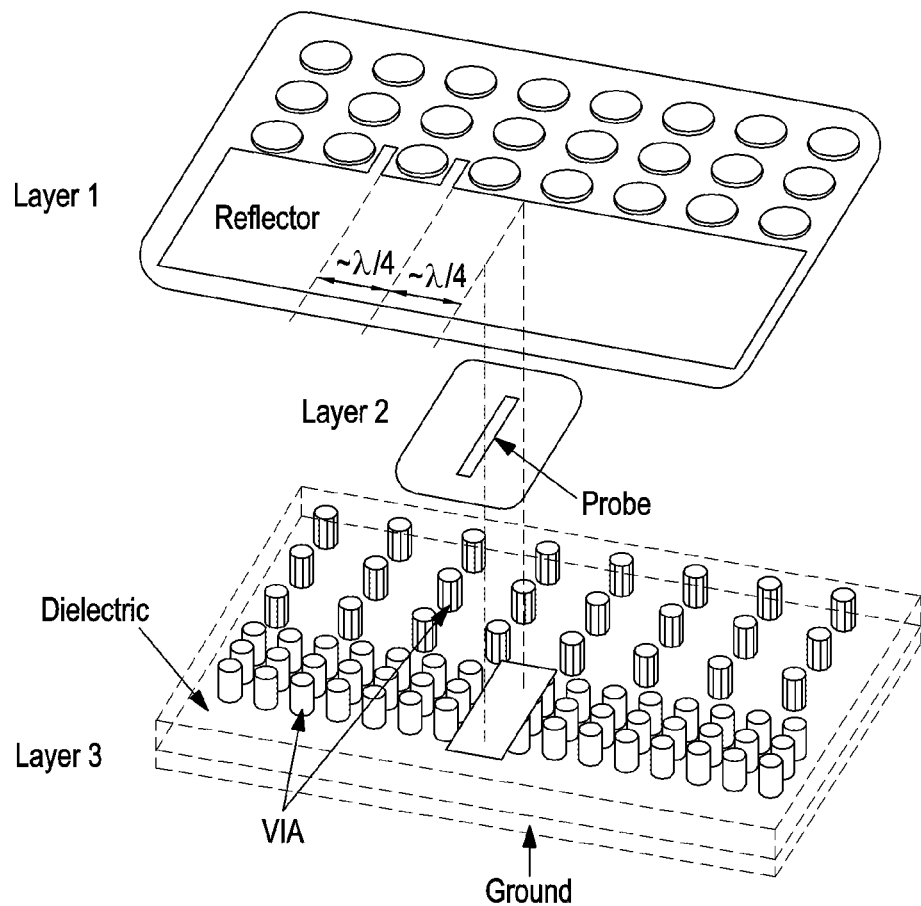
FIG. 7 is an exploded perspective layer view of a PCB section containing an antenna according to various embodiments.

VIAs in the first part of the PCB may be alternately formed around the perimeter of the first part of the PCB, or distributed over the entire area of the first part of the PCB (see, e.g., FIG. 7).

Figure 5:
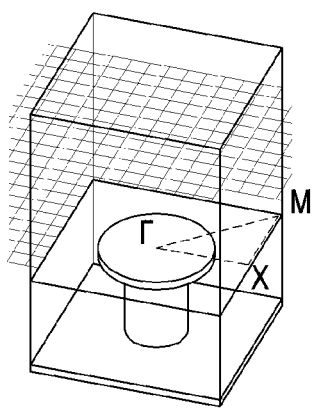
FIG. 5 is a perspective view illustrating an example structure of a unit cell of EBG structure according to various embodiments.

EBG structure comprises multiple cells arranged adjacently in a two-dimensional periodic array. FIG. 5 illustrates an example structure of a unit cell of the EBG structure according to various embodiments. The unit cell comprises a conductive part (e.g. a pad) disposed on the upper layer (e.g., layer 1 in FIG. 4) of the PCB, connected to a conductive element extending through the thickness of the PCB dielectric layer, for example, a plated through hole (VIA). The size and shape of the conductive parts are selected to suit the specific application requirements. As an example, the conductive part can be in the shape of a circle, square, polygon, etc. In general, conductive parts of adjacent cells are not electrically coupled.

The EBG structure may block the propagation of waves (leakage) at the required frequencies from the wireless link (waveguide) to the external space due to the formation, in the operating frequency range, of a bandgap in the wireless link region.

Figure 6A:
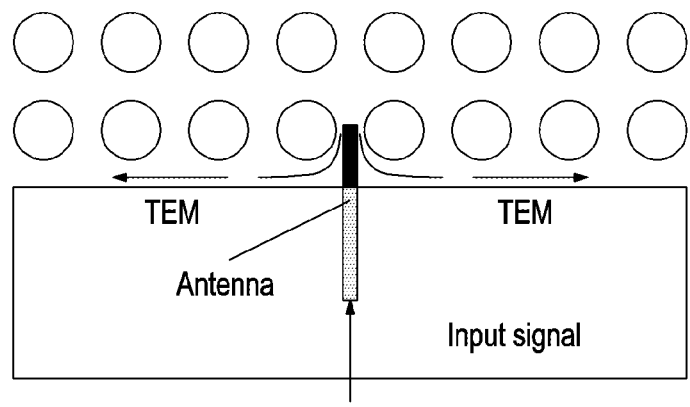
FIG. 6A is a diagram illustrating a top view of a PCB section containing an antenna, without reflectors according to various embodiments.
Figure 6B:
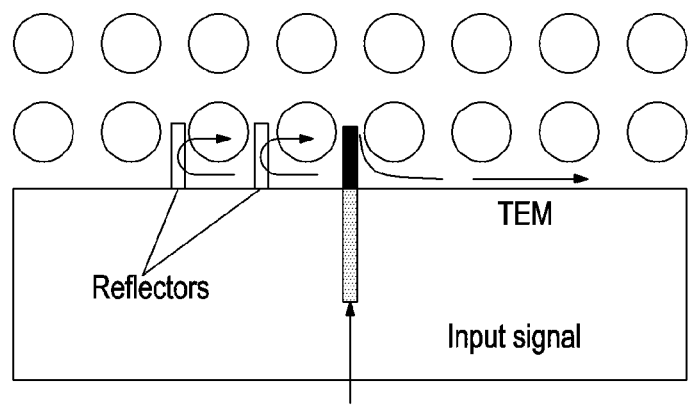
FIG. 6B is a diagram illustrating a top view of a PCB section containing an antenna, with reflectors according to various embodiments.

The signal electromagnetic field radiated from the antenna propagates in two directions along the EBG structure (see, e.g., FIG. 6A). With this, while one direction of signal propagation is useful as being the direction toward the receiving antenna, the signal propagation in the opposite direction must be prevented/restricted to avoid energy leakage. To this end, at least one reflector is disposed on the side opposite to the required direction of TEM mode propagation (e.g., towards the receiving antenna). An example embodiment comprises two reflectors (see, e.g., FIGS. 6B and 7) to ensure wider bandwidth matching. In this case, one reflector is placed at a distance of at least $\lambda/8$ from the conductive probe, and the second reflector is placed at a distance of at least $\lambda/8$ from the first reflector. In an embodiment, the distance between the conductive probe and the first reflector, as well as between the first and second reflector, is about $\lambda/4$ (see, e.g., FIG. 7). Here, the reflector is formed by a probe connected to a conductive half-plane (metal layer of the first part of the PCB) and extending towards the EBG structure. The reflector is similar to the wall of a rectangular waveguide positioned at a distance of about $\lambda/4$ from the electric probe (e.g., quarter-wave contactor). In this case, the wave reflected from the reflector will be in phase with the wave radiated by the conductive probe to the right of it (see, e.g., FIGS. 6A and 6B), which makes the probe impedance active. Thus, the signal reflected from the reflectors is in-phase added with the signal radiated towards the receiving antenna. The reflector length in the example embodiment is half the length of the EBG cell, e.g., the reflector protrudes beyond the region in which the TEM mode field is present. Optionally, the reflector can be designed to touch the element of the EBG structure.

In some cases, for additional matching, the converter structure comprises directors, guide elements. Their function is to improve matching in the signal bandwidth. The guide elements are mounted in the waveguide in the direction of TEM mode propagation at a distance of about $\lambda/4$ (minimum $\lambda/8$) from the antenna. In an embodiment, the guide element may include a probe connected to the conductive half-plane (metal layer of the first part of the PCB) and protruding towards the EBG structure.

Figure 8:
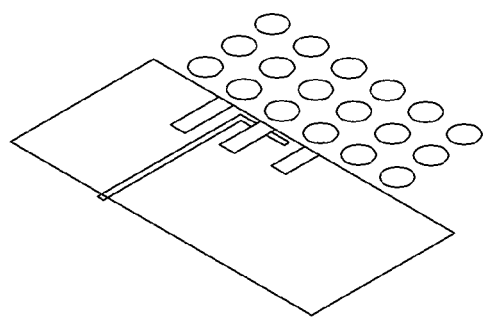
FIG. 8 is a diagram illustrating an example in which the reflector, antenna and guide element are slotted structures according to various embodiments.

The antenna for TEM mode excitation can be formed by a slotted structure in the upper layer of the PCB. This provides excitation of a wave with polarization normal to the conducting plane. The antenna in the form of a slotted structure may be excited by a transmission stripline disposed in one of the lower layers. In this example, reflectors and optional guide elements are passive elements-slots in the surface metal layer of the first part of the PCB with some dielectric volume inside the PCB, which provide signal reflection and matching. FIG. 8 is a diagram illustrating the upper layer of a PCB according to various embodiments, where the reflector, antenna and guide element (from left to right) are slotted structures.

Figure 9:
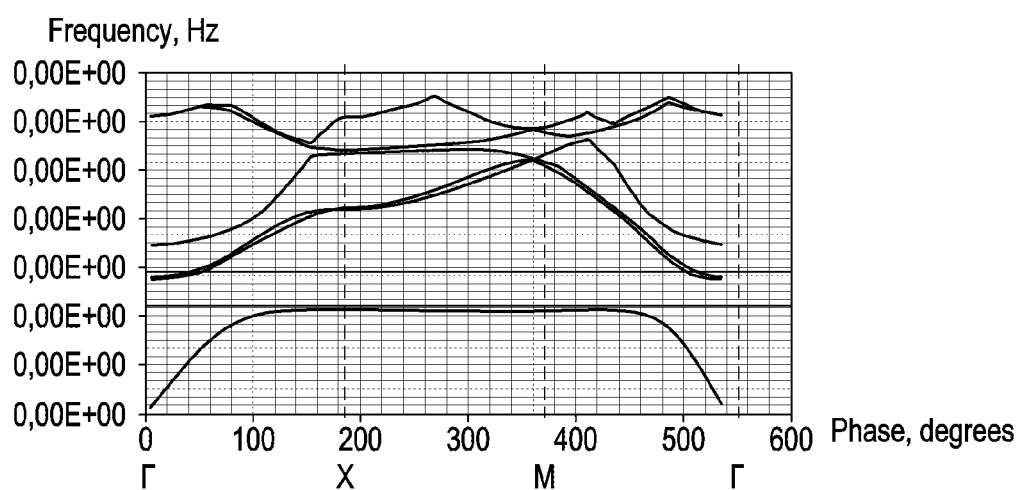
FIG. 9 is a graph illustrating the frequency response of a waveguide with EBG structure according to various embodiments.

A PCB-based EBG was simulated using a structure that required the Rogers RO4003® microwave substrate, and obtained respective plots shown in the graph of FIG. 9. As seen in the diagram of frequency of signal transmitted through the EBG structure versus phase shift realized in each cell of this structure, shown in FIG. 9, wave propagation is impossible in this structure in a certain frequency range (the bandgap located between two parallel lines on the vertical axis). Here, the first mode propagates at frequencies up to 53 GHZ, and the other modes propagate at frequencies from 69 GHz. Thus, due to the EBG structure, the power in the operating frequency range (for example, about 60 GHz) should not leak out beyond the waveguide, but should pass through the wireless link to the receiving antenna.

Accordingly, while having a compact size, a device of the present disclosure has very low losses and high data rate, and does not require strong and reliable contact between PCBs in its assembly.

A region remains between antennas inside the waveguide, in which a wireless link is formed for transmitting electromagnetic signals between the antennas. In the present disclosure, a TEM mode waveguide is used to concentrate electromagnetic field in the wireless link between PCBs. In FIG. 4, the arrow shows that electromagnetic wave can be excited both by the first antenna for transmission to the second antenna, and by the second antenna for transmission to the first antenna.

Thus, a high-frequency signal from RFIC (radio frequency integrated circuit) disposed on the side of the first PCB is supplied to input of the first antenna, radiated by it in the form of TEM mode into the wireless link, received from the wireless link by the second antenna, and transmitted from output of the second antenna to the RFIC disposed on the side of the second PCB. It should be understood that the terms "input" and "output" are conditional, and if necessary, the signal can be transmitted in the opposite direction.

In an embodiment, the PCBs described above can be two-layer PCBs. In this case, the signal supply lines will be in the form of a coplanar line in the upper metal layer. In other respects, this embodiment is similar to the above example embodiment of a wireless data transfer system.

In an embodiment, wireless data transfer can occur between integrated circuits disposed on the same PCB (for example, within the same unit). In this embodiment, both converter structures are disposed on the same PCB. In other respects, this embodiment is similar to the above example embodiment of a wireless data transfer system.

As stated above, the size, shape and arrangement of conductive parts of EBG cells are selected based on the requirements of a particular application. Conductive parts of EBG cells may be in the form of octagon, square, circle, triangle, etc. The conductive parts do not need to be centered with the VIA and can be misaligned. The structure must be periodic. In this case, the array can be square, rectangular, triangular, etc. This ensures versatility of arrangement of the cells and simple adaptation of the waveguide to the internal structures of the device in which it is to be used, as well as convenient adjustment of the required electrical characteristics.

The disclosed wireless data transfer system does not require galvanic contact between two PCBs, between which signals are to be transmitted. In the direction along the longitudinal axis of the system shown by way of non-limiting example in FIG. 4, the present disclosure allows the PCBs to be misaligned relative to each other such that the relative position of the first and second antenna is maintained to enable transmission of signals between them. In addition, the system illustrated in FIG. 4 allows the PCBs to be vertically misaligned relative to each other in the range up to $\lambda/4$. Thus, the present disclosure provides easier assembly and fabrication, since the structure greatly facilitates the manufacturing process and reduces the requirements to accuracy and process tolerances.

Therefore, the signal transmission device according to the present disclosure offers many advantages over the prior art. For example, the disclosure provides a wireless link with improved energy efficiency, reduced RF power leakage, and simpler assembly and fabrication. Data rate can be increased to 2 Gbps or more (e.g., experimental tests show that data can be transferred at 2.3 Gbps without significant jitter). The device geometry is more robust to mechanical distortion. No external shielding is required. The use of non-contact mechanics enhances reliability of contacts and reduces requirements for process tolerances. In these conditions no beam control is required. In addition, the present disclosure provides simpler integration with PCB technologies, increases operating bandwidth, improves compactness and enables varying the size of the device, and does not need galvanic interconnect between the device elements. The device is scalable, compact and broadband, has low losses and can be successfully used for applications in the millimeter and sub-THz ranges.

It should be understood that this disclosure illustrates the principle of construction and basic examples of a device for transmitting RF signals. Using these principles, a person skilled in the art will be able to obtain other variations of the disclosure without any creative effort.

The present disclosure can find application, for example, and without limitation, in electronic devices that require transmission of RF signals over a short distance, for example, in the millimeter range for 5G (28 GHz), WiGig (60 GHZ), Beyond 5G (60 GHz), 6G (sub-THz) mobile networks, for automotive radar systems (24 GHz, 79 GHz), for short-range communication (60 GHz), for smart home systems and other mm-range adaptive intelligent systems, for car navigation, for the Internet of Things (IoT), wireless charging, etc.

It should be understood that although terms such as "first", "second", "third", etc. may be used herein to describe various elements, components, regions, layers and/or sections, these elements, components, regions, layers and/or sections should not be limited by these terms. These terms are used simply to distinguish one element, component, region, layer or section from another element, component, region, layer or section. Thus, a first element, component, region, layer, or section may be called a second element, component, region, layer, or section without departing from the scope of the present disclosure. As used herein, the term "and/or" includes any and all combinations of one or more of the respective listed items. Elements mentioned in the singular do not exclude the plurality of elements, unless otherwise specified.

Functionality of an element referred to in the description or claims as a single element may be practiced by several components of the device, and vice versa, functionality of elements referred to in the description or claims as several separate elements can be implemented in practice by a single component.

Embodiments of the present disclosure are not limited to those described herein. A person skilled in the art may envisage, on the basis of the information disclosed in the description and the common knowledge in the art, further embodiments within the spirit and scope of this disclosure.

Elements mentioned in the singular do not exclude the plurality of the elements, unless otherwise specified.

A person skilled in the art should understand that the essence of the disclosure is not limited to a specific software or hardware implementation, and therefore any software and hardware means known in the art can be used to implement the disclosure. For example, hardware can be implemented in one or more specialized integrated circuits, digital signal processors, digital signal processing devices, programmable logic devices, user-programmable gate arrays, processors, controllers, microcontrollers, microprocessors, electronic devices, other electronic modules designed to perform the functions described in this disclosure, a computer, or a combination thereof.

Although various example embodiments have been illustrated and described in the accompanying drawings, it should be understood that such example embodiments are intended to be illustrative not limiting, and that the disclosure should not be limited to the specific arrangements and structures shown and described, as various other modifications may be apparent to those skilled in the art. It will also be understood that any of the embodiment(s) described herein may be used in conjunction with any other embodiment(s) described herein.

The features mentioned in various dependent claims, as well as the embodiments disclosed in various parts of the description, can be combined for the achievement of useful effects, even if the possibility of such a combination is not explicitly disclosed.

What is claimed is:

1. A wireless data transfer system, comprising:
   a first printed circuit board and a second printed circuit board, the first and second printed circuit boards being separated by an air gap,
   wherein each of the first and second printed circuit boards includes two adjacent parts, a first part comprising a conductive metal layer on its surface and at least a series of plated through holes along the adjacent second part, and a second part comprising an electromagnetic band gap (EBG) structure comprising an electromagnetic material, wherein the first part of the first printed circuit board with the metal surface layer is positioned opposite the second part of the second printed circuit board with the EBG structure, and to form a transverse electromagnetic (TEM) mode waveguide;
   wherein each of the first and second printed circuit boards includes a converter structure configured to: perform conversion between the signal transmission line mode and the TEM mode in the waveguide, provide directive excitation of TEM mode in the waveguide based on a signal being transmitted, and receive in TEM mode and convert it to the signal transmission line mode based on a signal is received, and connected to a radio frequency (RF) component comprising RF circuitry;
   wherein the converter structure includes: an antenna, a signal transmission line between the antenna and the RF component, and at least one reflector configured to provide directive propagation of the TEM mode in the waveguide;
   wherein a width of the air gap between at least the first and second printed circuit boards does not exceed $\lambda/4$, where $\lambda$ is a wavelength of the transmitted signal.

2. The wireless data transfer system according to claim 1, wherein at least one of the first and second printed circuit board includes two converter structures configured to: perform conversion between the signal transmission line mode and TEM mode in the waveguide, each of the two converter structures configured to provide directive excitation of TEM mode in the waveguide based on a signal being transmitted, and receive TEM mode and convert it to the signal transmission line mode based on a signal being received, and connected to an RF component comprising RF circuitry.

3. The wireless data transfer system according to claim 1, wherein the antenna comprises a conductive probe extending into the second part with the EBG structure.

4. The wireless data transfer system according to claim 1, wherein the antenna comprises a slotted structure.

5. The wireless data transfer system according to claim 1, wherein the reflector is mounted at a distance of at least $\lambda/8$ from the antenna on the side opposite to the required direction of TEM mode propagation.

6. The wireless data transfer system according to claim 5, wherein the reflector is mounted at a distance of $\lambda/4$ from the antenna.

7. The wireless data transfer system according to claim 5, wherein the converter structure includes two reflectors positioned at a distance of at least $\lambda/8$ from each other.

8. The wireless data transfer system according to claim 7, wherein the reflectors are positioned at a distance of $\lambda/4$ from each other.

9. The wireless data transfer system according to claim 1, wherein the reflector comprises a probe connected to the metal layer of the first part and extending towards the EBG structure, or a slot in the metal layer of the first part.

10. The wireless data transfer system according to claim 1, wherein the converter structure further comprises at least one guide arranged in the direction of TEM mode propagation at a distance of at least $\lambda/8$ from the antenna.

11. The wireless data transfer system according to claim 10, wherein the guide is positioned at a distance of $\lambda/4$ from the antenna.

12. The wireless data transfer system according to claim 10, wherein the guide comprises a probe connected to the metal layer of the first part and extending towards the EBG structure, or a slot in the metal layer of the first part.

13. The wireless data transfer system according to claim 1, wherein each of the first and second printed circuit boards include two-layer or three-layer printed circuit boards.

14. The wireless data transfer system according to claim 1, wherein the RF circuitry comprises a radio frequency integrated circuit (RFIC).

15. The wireless data transfer system according to claim 1, wherein the distance between edges of the plated through holes located in the first part along the second part is no more than $\lambda/2$.

* * * * *